United States Patent [19]

Jackson et al.

[11] Patent Number: 5,578,837
[45] Date of Patent: Nov. 26, 1996

[54] INTEGRATING HYPERACUITY SENSORS AND ARRAYS THEREOF

[75] Inventors: Warren B. Jackson, San Francisco; David K. Biegelsen, Portola Valley; Richard L. Weisfield, Los Altos, all of Calif.

[73] Assignee: Xerox Corporation, Stamford, Conn.

[21] Appl. No.: 368,114

[22] Filed: Jan. 3, 1995

[51] Int. Cl.$^6$ .................... H01L 29/04; H01L 31/036; H01L 31/0376; H01L 31/20
[52] U.S. Cl. .................... 257/53; 257/59; 257/444; 257/448; 250/208.1; 250/370.08; 250/370.14
[58] Field of Search ................ 257/59, 53, 443, 257/448, 459, 444; 250/370.08, 370.09, 370.1, 370.14, 208.1

[56] References Cited

U.S. PATENT DOCUMENTS 3,676,715  7/1972  Brojdo ........................... 307/304
4,845,355  7/1989  Nakagawa et al. ........... 250/211 J

FOREIGN PATENT DOCUMENTS

0206363A1  12/1986  European Pat. Off. .
0214408A3   3/1987  European Pat. Off. .
56-32777    4/1981  Japan ............................ 257/443
4-024964    1/1992  Japan ............................ 257/448

Primary Examiner—William Mintel

[57] ABSTRACT

Sensor elements which are capable of sensing illumination edges with subpixel accuracy are described. The sensor elements include a plurality of conductive storage nodes and a plurality of collection electrodes which are in a low resistance, touching relationship with a first semiconductive material layer. A second semiconductive material layer is placed over the first such that the first and second semiconductive material layers and the storage nodes form light sensors. Near the first semiconductive layer is a gate electrode. When a first voltage is applied to the gate electrode the resistance of the first semiconductive material layer between the storage nodes and the conductive collection electrodes is high. Illumination which strikes the sensor element creates electron hole pairs which induce charges on the storage nodes. When a second voltage is applied to the gate electrode the resistance of the first semiconductive material layer between the storage nodes and the conductive collection electrodes becomes low. Charges which have accumulated onto the storage nodes can then easily flow to the conductive collection electrodes.

7 Claims, 6 Drawing Sheets

INTEGRATING HYPERACUITY SENSORS AND ARRAYS THEREOF

This invention relates to image sensing.

BACKGROUND OF THE PRESENT INVENTION

Most prior art image sensing devices operate by projecting an image that is to be scanned onto an array of discrete image sensor elements (usually p-i-n diodes). The projected image is then measured by interrogating the state of each of the sensor elements. For example, FIG. 1 shows a 4×5 sensor element section of an array 10 onto which an image having an edge 12 is projected. The term edge is used herein to mean the border defined by light illuminated areas and areas under darker conditions. It is assumed that the area of the array 10 above the edge 12 is illuminated, while the area below the edge is dark.

The twenty sensor elements, shown as the twenty squares 14, are organized into rows A through D, and columns R through V. To scan the image, the illumination state of each of the sensor elements is usually determined using matrix addressing techniques. If a particular sensor element is sufficiently illuminated, for example the sensor element 14 at row A, column R, the charge accumulating on the sensor element since the last read is sensed as being at a first state (ON). If a particular sensor element has not been sufficiently illuminated since the last read, say the sensor element 16 at row D, column V, that sensor element is sensed as being in a second state (OFF). Such sensor elements are called binary sensor elements. If a particular sensor element is partially illuminated, its state depends upon such things as how much of the sensor element was illuminated, the intensity of that illumination, and the duration of that illumination.

An interrogation of all of the illustrated sensor elements of the array 10 results in the rather coarse approximation to the image as shown in FIG. 1, with the ON state sensor elements in white and the OFF state sensor elements in crosshatch. This representation results from a binary thresholding of the pixel (sensor element) values. An alternative prior art array uses sensor element which are capable of reading values of the average illumination applied to that sensor element, the so called gray scale sensor elements. With either gray scale or binary sensor element, the edge position information within a pixel is converted into a spatial average.

It is highly desirable to have sensor arrays which match the human visual system's ability to sense edges. That ability is called hyperacuity since the human visual system senses edge positions much better than it does most other image characteristics. With the prior art sensor elements described above, any increase in the accuracy of the imaging of edge position, or equivalently, any improvement in hyperacuity, smaller and more numerous sensor elements are required. However, fabricating closely spaced, but isolated, sensor elements becomes excessively difficult as the sensor element density increases sufficiently to approximate to the hyperacuity capability of the human visual system.

In addition to the discrete sensor elements described above, another type of sensor element, called a position sensitive detector, is known in the prior art. An example of a position sensitive detector is the detector 20 shown in FIG. 2. The detector 20 outputs photoinduced analog currents into lines 22, 24, 26, and 28. Those currents can be used to determine the position of the centroid of the illuminating light spot 30. The centroid of the light spot in the x-direction (horizontal) can be computed from the quantity $(I_{26}-I_{28})/(I_{26}+I_{28})$, while the centroid of the light spot in the y-direction (vertical) can be computed from $(I_{22}-I_{24})/(I_{22}+I_{24})$, where $I_{2x}$ is the current on one of the lines. At least partially because position sensitive detectors are usually rather large (say from about 1 cm×1 cm to 5 cm×5 cm), they have not been used in imaging arrays.

Even with sensor element density levels far below those required to match the hyperacuity ability of the human visual system, the multiplexing of the sensor element signals from an array of sensor elements onto external access lines is very important. When multiplexing, the ability to integrate the response of each sensor element during time periods between reads is important since integration maximizes the sensor element's signal-to-noise ratio. While multiplexing large numbers of sensor elements of any type is difficult, position sensors are particularly difficult to multiplex. This is because the outputs of position sensitive detectors are preferably currents. Therefore, the lines 22 through 28 are held near ground during reading. Integration therefore requires a large number of dedicated readout channels which is contrary to the use of multiplexing. A large number of readout channels adds considerable cost and complexity to the array.

As discussed above, the acuity of prior art imaging scanners is limited by the density of the individual sensor elements which comprise the scanner's sensor array. This limitation has been overcome by a new type of small sensor elements which is capable of ascertaining spatial information about the light falling within individual elements. Such sensor elements, which are somewhat related to position sensors, are described in co-pending U.S. patent application Ser. No. 08/152,044 entitled, "Hyperacuity Sensing." That patent application is hereby incorporated by reference. Unfortunately, those sensor elements are not easily multiplexed.

Because of the difficulties of achieving high spatial resolution of edges by increasing the pixel density, and the difficulty of using position sensitive type detectors in multiplexed applications, a new type of imaging sensor element which is capable of subpixel edge position accuracy and which can easily be multiplexed would be beneficial.

SUMMARY OF THE INVENTION

The present invention provides for sensor elements which are capable of sensing edge information with subpixel accuracy. Such sensor elements can be implemented as charge integrating light sensors which are suitable for incorporation into a variety of imaging arrays and which can easily be multiplexed. The inventive sensor elements include a plurality of conductive storage nodes which are in a low resistance relationship with a first semiconductive material layer, beneficially of undoped amorphous silicon. Also in a low resistance relationship with the first semiconductive material are a plurality of conductive collection electrodes. Over the first semiconductive material layer is a second semiconductive material layer. The first semiconductive layer, the second semiconductive material layer, and the storage nodes form light sensors. Near the first semiconductive layer is a gate electrode. When a first voltage is applied to the gate electrode, the resistance of the first semiconductive material layer between the storage nodes and the conductive collection electrodes is relatively high. Illumination which strikes the sensor element creates electron hole pairs which induce charges on the storage nodes. When a second voltage is applied to the gate electrode, the resistance of the first semiconductive material layer between the storage nodes and the conductive collection electrodes becomes relatively low. Charges on the storage nodes can then easily flow to the conductive collection electrodes. If the collection electrodes are connected to relatively low resistance external device, currents flow out of the collection electrodes. Those currents can be analyzed to determine information, such as edge information, about the illumination.

BRIEF DESCRIPTION OF THE DRAWINGS

Other aspects of the present invention will become apparent as the following description proceeds and upon reference to the drawings, in which.

Note that the subsequent text includes various directional signals (such as right, left, up, down, top, bottom, lower and upper) which are taken relative to the drawings. Those directional signals are meant to aid the understanding of the present invention, not to limit it.

DETAILED DESCRIPTION OF THE ILLUSTRATED EMBODIMENTS

As discussed above, the hyperacuity ability of most prior art imaging scanners is limited by the density of the sensor elements which comprise the scanner's sensor array. While this limitation can be overcome by using sensor elements that can be used to ascertain the centroid of the light falling on themselves, such sensor elements can not easily be multiplexed. The principles of the present invention provide for sensor elements which are capable of subpixel edge position sensing and which can readily be multiplexed. Arrays made from such sensor elements can have an improved hyperacuity ability.

The present invention is related to the technology described in co-pending U.S. patent applications Ser. No. 08/368,131, entitled, "PIXEL ELEMENTS HAVING RESISTIVE DIVIDER ELEMENTS," Ser. No. 08/368,138, entitled, "SEGMENTED RESISTANCE LAYERS WITH STORAGE NODES." Those patent applications are hereby incorporated by reference.

An Integrating Sensor Element

Figure 1:
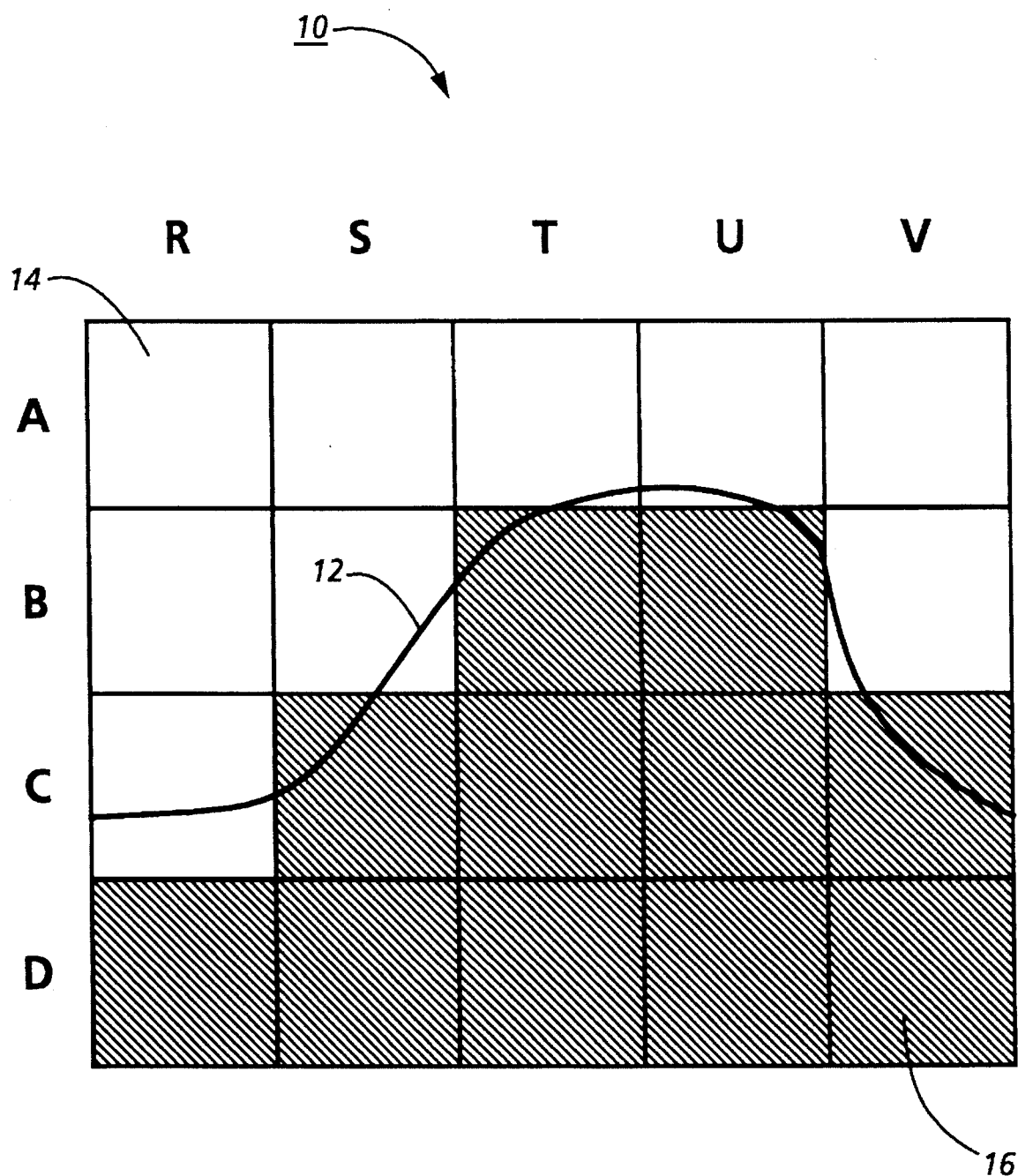
FIG. 1 shows a schematic depiction of a 4 element by 5 element section of a prior art imaging array.
Figure 2:
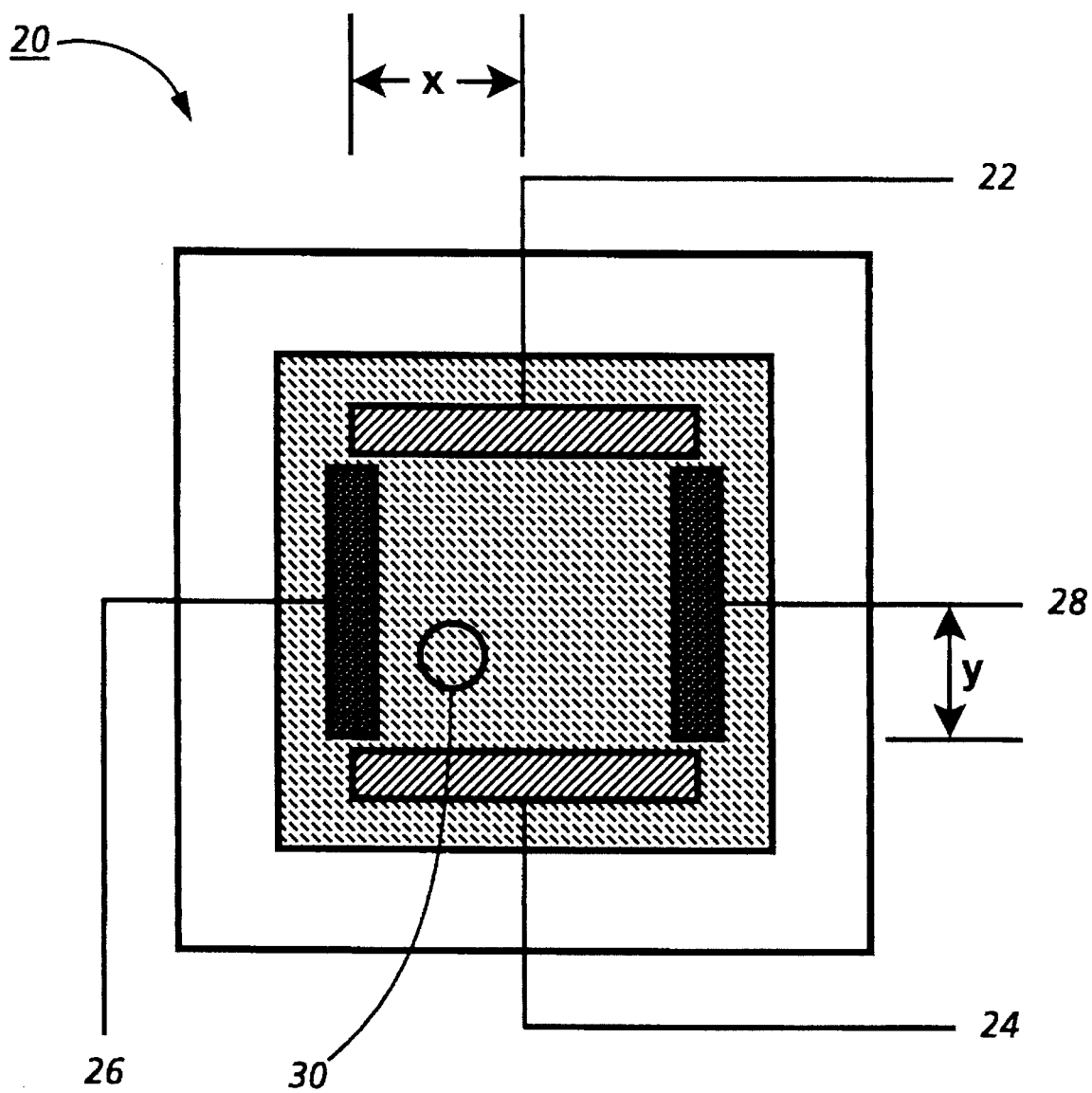
FIG. 2 shows a simplified schematic depiction of a prior art position sensitive detector.
Figure 3:
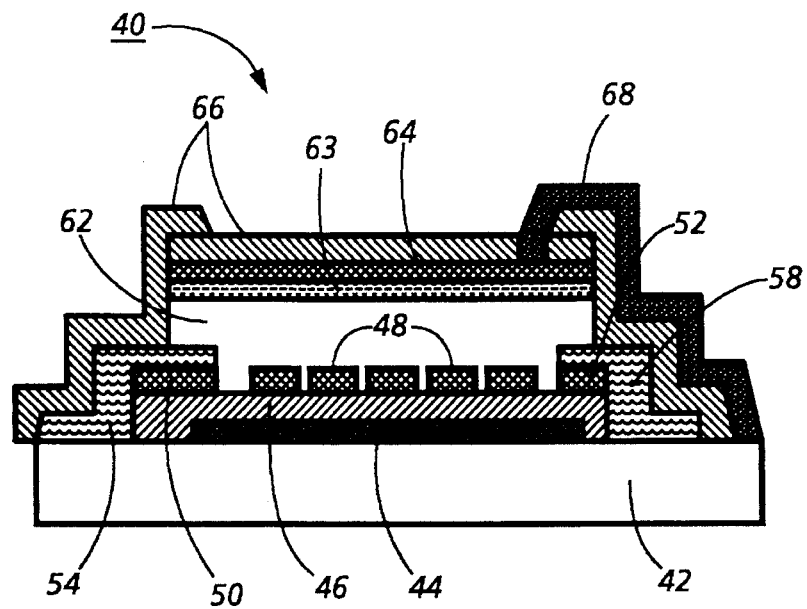
FIG. 3 shows a cut-away view of a sensor element according to the principles of the present invention.
Figure 4:
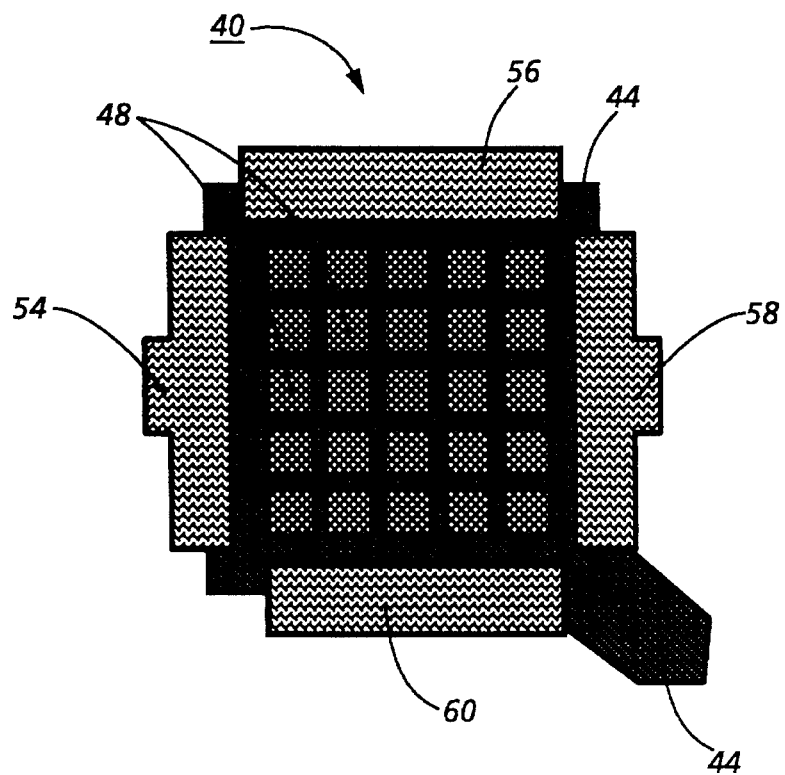
FIG. 4 shows a top down view of the sensor element shown in FIG. 3.

FIGS. 3 and 4 depict a sensor element 40 that is in accord with the principles of the present invention. The sensor element 40 is beneficially fabricated so that it is small enough to fit into an array of sensor elements which can detect spatial distributions of light intensity at about 400 spots per inch. The sensor element is comprised of a substrate 42 over which is located a gate electrode 44. An electrically insulating layer 46 is formed over the gate electrode 44. Beneficially the insulating layer is of silicon nitride. A highly doped semiconductor layer, beneficially of highly phosphorus doped amorphous silicon, is then deposited on the insulating layer 46.

That semiconductor layer is patterned, typically via masking and etching, to form a plurality of storage nodes 48 and four collection contacts. The remainder of the semiconductor layer is etched away. While the figures show only two of the collection contacts, the collection contacts 50 and 52 shown in FIG. 3, the other two collection contacts are located under metallic collection electrodes. The sensor element 40 has four metallic collection electrodes (beneficially of Cr), the collection electrodes 54, 56, 58, and 60. The collection electrodes 54 and 58 are placed over the collection contacts 50 and 52, respectively. The collection electrodes 56 and 60 cover the two collection contacts which are not shown. The collection electrodes are formed such that they make low resistance contacts with their associated collection contacts.

While the sensor element 40 has four collection electrodes, in practice other numbers of collection electrodes can be used. Additionally, while the sensor element 40 has collection electrodes which describe a square, other geometrical relationships may be used to meet the particular application.

Over the storage nodes, parts of the collection electrodes, and the exposed parts of the insulating layer 46 and the collection contacts are deposited stacks of semiconductor materials which form layers 62 and 63. Layer 62 is comprised of an approximately 1 μm thick undoped amorphous silicon layer. The layer 63 is comprised of a thin (5–10 nm) boron-doped amorphous silicon layer. The storage nodes 48 and the layers 62 and 63 form light sensors. Over the semiconductor material 63 is deposited a transparent conductive layer 64 of indium tin oxide. A passivation layer 66 is then deposited over the existing structure. Vias to the transparent conductive layer 64, the collection electrodes 54 through 60, and the gate electrode 44 are made through the passivation layer 66. Finally, a metal conductor 68 which makes contact with the transparent conductive layer 64 is formed over the passivation layer. For clarity, FIG. 4 does not show the metal conductor 68.

Operation of the Integrating Sensor Element

In operation, external illumination which is to be imaged is radiated onto the sensor element 40. The illumination passes through the transparent conductive layer 64 and the passivation layer 66 and radiates onto the light sensors formed by the layers 62 and 63 and by the storage nodes 48. The impinging photons create electron-hole pairs in the light sensor which induce charges on the storage nodes 48.

With a low voltage applied to the gate electrode 44, the resistance of the layer 62 is high. Charges then build up over time, they are integrated, onto the various storage nodes 48 as functions of the spatial distribution of the illumination on the light sensor. If an edge occurs in the illumination, the charges on the storage nodes under areas of high illumination become relatively large. In contrast, the quantity of the charges on the storage nodes under areas of low illumination stays relatively small. Therefore, charges accumulate on each storage node in proportion to the intensity of the illumination and its time duration.

When a high voltage is applied to the gate electrode 44 the resistance of the layer 62 becomes low. This permits the charges which have built up on the storage nodes 48 to flow to the collection electrodes 54 through 60. If the external resistances applied to the collection electrodes are low compared with the on-state resistance of the layer 62 between the storage nodes, currents flow out of the various collection electrodes and into external resistances in proportion to the amount of charges built up on the various storage nodes and as a function of the relative positions of the various storage nodes to each collection electrode. The currents from the collection electrodes are then applied to external amplifiers.

A Crystalline Silicon Integrating Sensor Element

Figure 5:
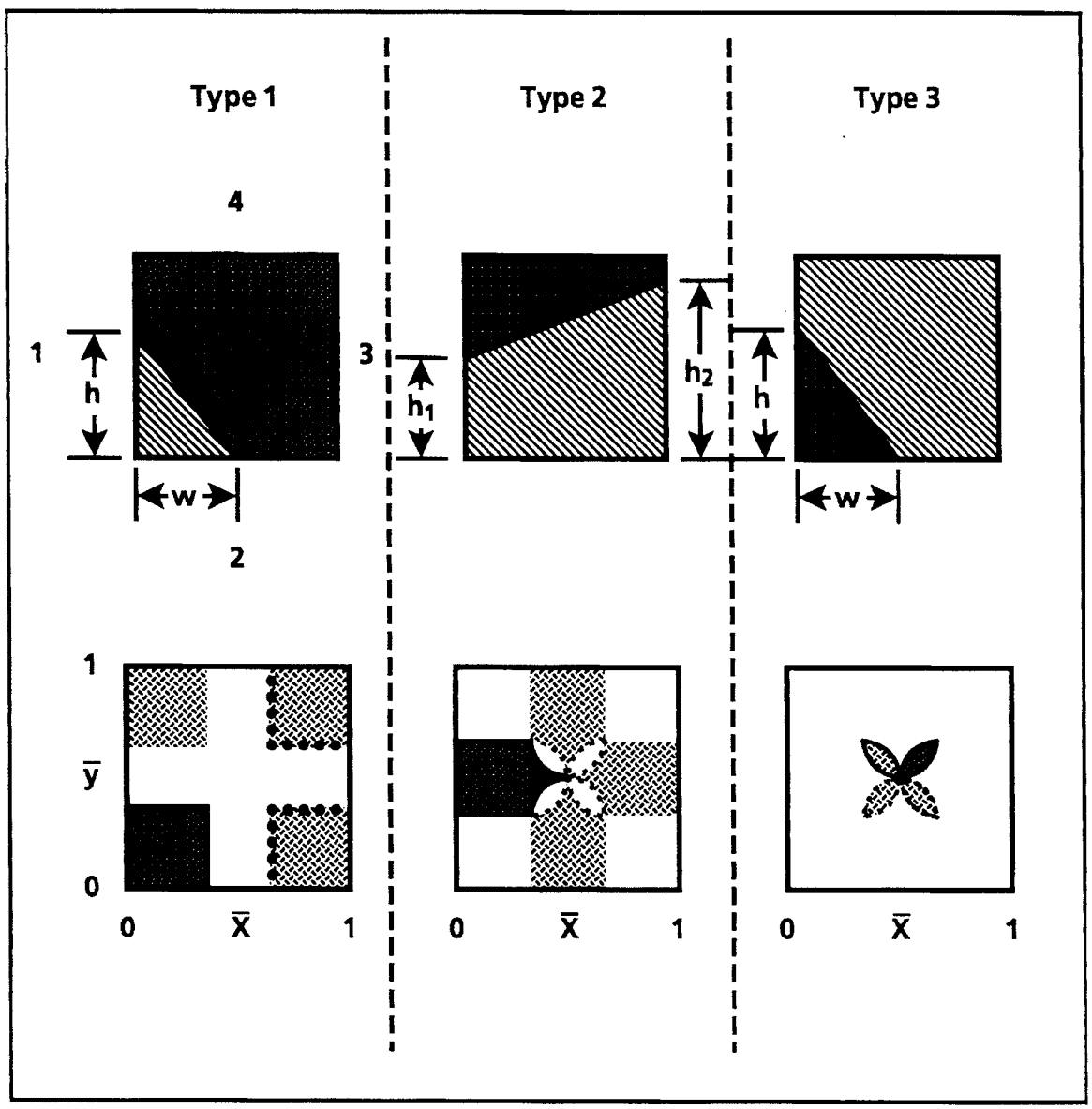
FIG. 5 shows a cut-away view of a sensor element according to the principles of the present invention which is particularly suitable for use with crystalline semiconductor materials.

FIG. 5 depicts a sensor element 200 that is in accord with the principles of the present invention and which is more appropriate for use with crystalline semiconductors than the sensor element 40. The sensor element 200 is beneficially fabricated so that it is small enough to fit into an array of sensor elements which can detect spatial distributions of light intensity at about 400 spots per inch.

The sensor element 200 includes a p-doped semiconductor substrate 202. An intrinsic compensated doped well 203 is formed in that substrate either by ion implantion or diffusion. Small shallow regions of heavily n-type doped material are then formed in the well 203 (beneficially either by a shallow implant or by diffusion through appropriate masks). Those small regions become either storage nodes 204 or collection contacts 206 and 208. Collection electrodes 210 and 212 are then formed over the collection contacts 206 and 208, respectively. The collection electrodes are formed such that they make low resistance contacts with the collection contacts. While FIG. 5 shows only two collection contacts and two collection electrodes, in practice other numbers of collection contacts and collection electrodes can be used to meet the particular application. To parallel the sensor element 40, it is assumed that the sensor element 200 has four collection contacts and four collection electrodes organized in a square.

A dielectric layer 214, beneficially of silicon dioxide, is then grown (or deposited) over the well 203 between the collection electrodes. A transparent conducting gate electrode 216, beneficially of doped polycrystalline material is then deposited over the dielectric layer. Over the top of the structure is deposited a passivation layer 218. Vias to the collection electrodes are then made through the passivation layer 218. Finally, a sensor electrode 220 is then deposited under the substrate 202.

Operation of the Crystalline Silicon Integrating Sensor Element

In operation, external illumination which is to be imaged is radiated onto the sensor element. That illumination passes through the passivation layer and the transparent conductive layer and irradiates light sensors formed by the p-doped substrate 202, the compensated well 203 and the n-doped storage nodes 204. The impinging photons create electron-hole pairs in the light sensor which induce charges on the storage nodes.

With a low voltage applied to the gate electrode, 216 the resistance of the well 203 is high between the storage nodes, 204 and the collection electrodes 206 and 208. Charges then build up over time; they are integrated, onto the various storage nodes as functions of the spatial distribution of the illumination on the light sensor. If an edge occurs in the illumination, the charge densities on the storage nodes under areas of high illumination become relatively large. In contrast, the number of charges on the storage nodes under areas of low illumination stays relatively small. Therefore, charges accumulate on each storage node in proportion to the intensity of the illumination and its time duration.

When a high voltage is applied to the gate electrode 216 the resistance of the well 203 between the storage nodes 204 and the collection electrodes 206 and 208 becomes low. This permits the charges which have built up on the storage nodes to flow to the collection electrodes. If the external resistances applied to the collection electrodes are low compared with the on-state resistance of the well between the storage nodes, currents flow out of the various collection electrodes and into external resistances in proportion to amount of charges built up on the various storage nodes and as a function of the relative positions of the various storage nodes to each collection electrode. The currents from the collection electrodes are then applied to external amplifiers.

A Use for the Currents from the Collection Electrodes

Since the currents from the various collection electrodes are a result of the charges induced on the storage nodes, which are a result of the intensity distribution of the illuminating light integrated over time, those currents can be used to determine a number of different attributes of the illuminating light. For example, those currents can be analyzed to determine the position of the centroid of the illumination on the sensor element. Those currents can also be used to approximate the position of an edge which occurs in the illuminating light. In other words, the currents from the collection electrodes can be analyzed wherein the position of an illumination edge is approximated with subpixel accuracy.

The steps to approximating the position of the edge are three fold. First, a parametric model for the distribution of light within a sensor element is determined. Then, using the currents from the collection electrodes, referred to hereinafter as $I_1$ through $I_4$, the parameters for the distribution of light model are determined. Finally, those parameters are applied to the model to determine the edge position approximation.

A particularly useful model for hyperacuity sensing is referred to as the edge model. In the edge model, the illuminating light intensity is assumed to be a straight line which subtends the active area of the sensor element. While approximating the edge of the illuminating light, which may not be straight, with a straight line may, at least at first, appear unacceptable, such a linear approximation is quite good if the size of the sensor element is comparable with or smaller than the smallest curvature of interest. Using the edge model the locations at which the straight line edge approximation intersects the boundary of the sensor element (as well as the gray level) can be determined from the four currents $I_1$ through $I_4$. It is assumed that the currents $I_1$ and $I_3$ are currents from collection electrodes that are on opposite sides of the sensor element (such as the collection electrodes 54 and 58). Likewise, it is assumed that the currents $I_2$ and $I_4$ are from collection electrodes that are on the other opposite sides of the sensor element (such as the collection electrodes 56 and 60).

Figure 6:
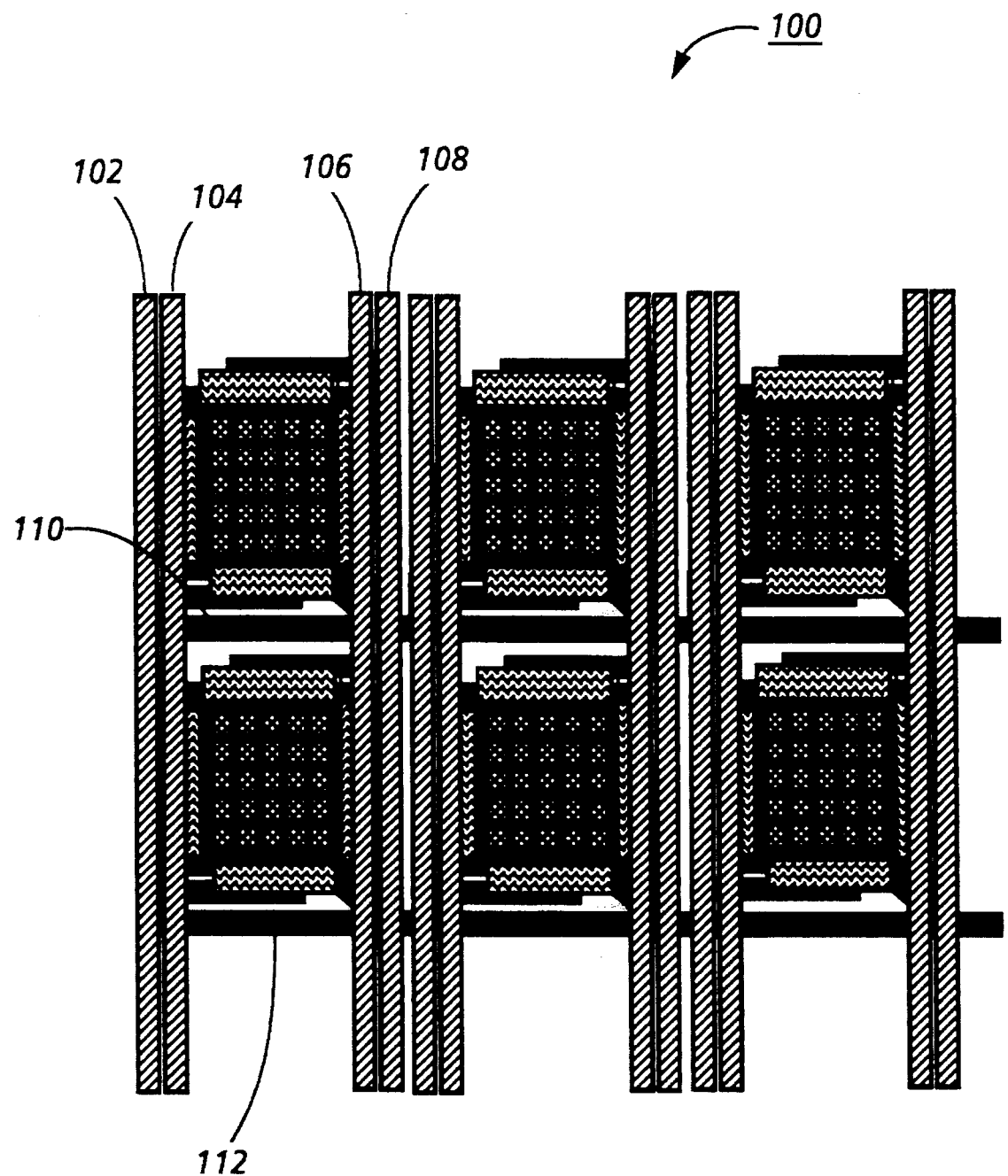
FIG. 6 illustrates various models which are useful for edge approximation when using sensor elements according to FIGS. 3 and 4.

Referring now to FIG. 6, the determination of the approximation of the edge position in terms of the measured currents can be accomplished using the edge model as follows. First, the current ratios $\bar{x}=I_3/(I_1+I_3)$ and $\bar{y}=I_4/(I_2+I_4)$, are computed. Then, using the current ratios, the intercepts of an approximated edge with the boundaries of the sensor element are determined based upon where the current ratios lie in the $(\bar{x}, \bar{y})$ plane. If the point $(\bar{x}, \bar{y})$ falls within the region defined by the black square in the lower, left panel of FIG. 6, then the edge approximation is deemed to intercept the x axis at $w=3L\bar{x}$ and the y axis at $h=3L\bar{y}$, where L is the length of the side of the sensor element. This condition, which corresponds to the illumination condition shown in the upper, left panel of FIG. 6, is referred to as a type 1 condition. Using symmetry, the edge intercepts of the gray areas shown in the lower left panel of FIG. 6 can be found in the same manner by using other values of $(\bar{x}, \bar{y})$.

Now, if the point $(\bar{x}, \bar{y})$ falls within the black region of the lower, center panel in FIG. 6, the edge approximation intercepts $h_1$ and $h_2$ are given by $(2-3\bar{x})\bar{y}L/(1-3\bar{x}(1-\bar{x}))$ and $(-1+3\bar{x})\bar{y}L/(1-3\bar{x}(1-\bar{x}))$, respectively. This condition, which corresponds to the illumination condition in the upper, center panel of FIG. 6, is referred to as the type 2 condition. Finally, if $(\bar{x},\bar{y})$ falls within the black region depicted in the lower, right panel of FIG. 6, the edge approximation intercepts h and w are found from the relations $h=(\bar{x}-\frac{1}{2})L^2/(\bar{x}w/2-w^2/6L)$ and $w=(\bar{y}-\frac{1}{2})L^2/(\bar{y}h/2-h^2/6L)$. This condition, which corresponds to the illumination condition shown in the upper, right panel of FIG. 6, is referred to as the type 3 condition. Again, other values of $(\bar{x}, \bar{y})$ yield edge approximation intercepts with the sensor boundary by various rotation and mirror operations.

Arrays of Sensor Elements

Figure 7:
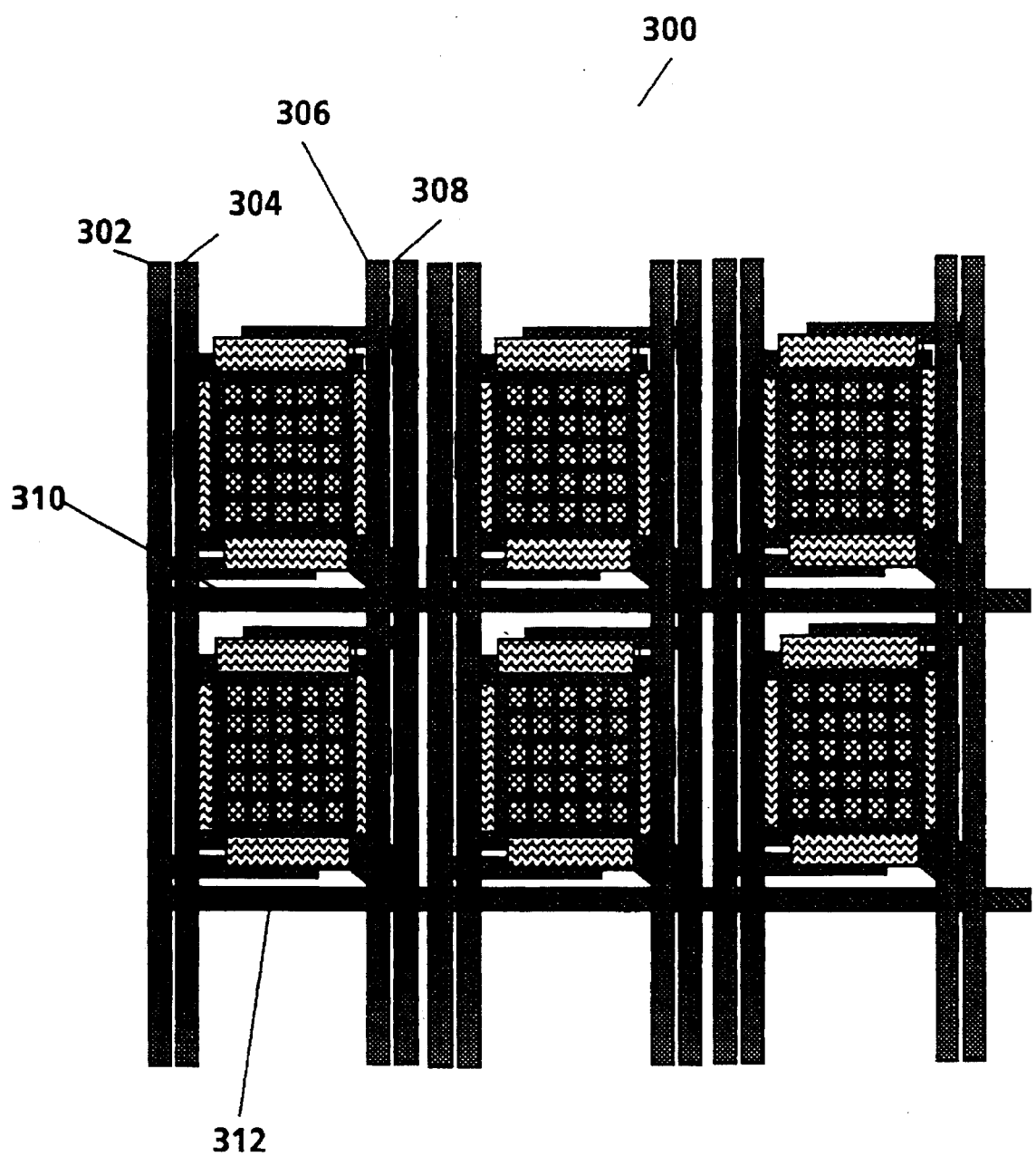
FIG. 7 depicts an array of sensor elements according to FIGS. 3 and 4.

The sensors elements 40 can be used in arrays of sensor elements and can readily be multiplexed. For example, FIG. 7 shows an array 300 which is comprised of six sensor elements 40 organized into a 2×3 array. Since each sensor element 40 has four collection electrodes, and since the array 300 is to be multiplexed, the collection electrodes of each sensor element in a column are connected to collection electrode bus lines, the lines 302, 304, 306, and 308. While FIG. 7 shows only one set of lines 302, 304, 306, and 308, each column will have its own set. In operation, each of the collection electrode bus lines connects to a current amplifier (which is not shown). Additionally, the gate electrodes of the sensor elements in each row are connected to a gate line, the gate lines 310 and 312.

To use the array 300, a gate turn on voltage is applied to one of the gate lines, say gate line 310. The gate turn on voltage causes the lateral resistance of the semiconductor material layer 62 in each sensor element in the row to go low.

This causes the storage nodes 48 of the sensor element connected to the row with the gate turn on voltage applied to create currents which flow into the collection electrode bus lines. To select another set of sensor elements, the gate turn on voltage is applied to the next gate line.

Meanwhile, sensor elements that do not have a voltage applied to their gate electrode are integrating photoinduced charges on their storage nodes 48. Because most of the time the sensor elements are integrating photoinduced charges, high signal to noise ratios are obtained.

From the foregoing, numerous modifications and variations of the principles of the present invention will be obvious to those skilled in its art. In particular, the shape and compositions of the sensor elements may be changed to fit a particular application. Additionally, the present invention can be used with a wide range of electromagnetic radiation, including X-rays, and with particles. Therefore the scope of the present invention is limited only by the appended claims.

What is claimed:

1. A sensor element comprised of:

a plurality of conductive storage nodes;

a plurality of conductive collection electrodes;

a first semiconductive material layer to form low resistance contacts with said plurality of storage nodes and with said plurality of collection electrodes;

a second semiconductive material layer adjacent said first semiconductive layer and wherein said first semiconductive material layer, said second semiconductive material layer, and said storage nodes are sensitive to illumination; and a gate electrode proximate said first semiconductive layer;

wherein a first voltage applied to said gate electrode causes said first semiconductive material layer to have a first resistance between said plurality of storage nodes and said plurality of collection electrodes such that illumination radiated onto said second semiconductive material layer induces charges on said plurality of storage nodes, and wherein a second voltage applied to said gate electrode causes said first semiconductive material layer to have a second resistance lower than said first resistance between said plurality of storage nodes and said plurality of collection electrodes such that charges on said plurality of storage nodes can flow to said plurality of collection electrodes.

2. The sensor element according to claim 1, further including a conductive layer over said second semiconductive material layer.

3. The sensor element according to claim 1, further including a substrate onto which said gate electrode is attached.

4. The sensor element according to claim 3, further including an isolation layer over said gate electrode.

5. The sensor element according to claim 1 wherein said first semiconductive layer is amorphous silicon.

6. The sensor element according to claim 1 wherein said illumination is visible light.

7. The sensor element according to claim 1 wherein said first semiconductive layer is crystalline silicon.

\* \* \* \* \*